United States Patent
Saitou et al.

(10) Patent No.: US 8,610,228 B2
(45) Date of Patent: Dec. 17, 2013

(54) SOLID-STATE IMAGE SENSOR

(75) Inventors: Shigeru Saitou, Osaka (JP); Keisuke Tanaka, Toyama (JP); Kimiaki Toshikiyo, Osaka (JP); Yutaka Hirose, Kyoto (JP); Motonori Ishii, Osaka (JP)

(73) Assignee: Panasonic Corporation, Osaka (JP)

( * ) Notice: Subject to any disclaimer, the term of this patent is extended or adjusted under 35 U.S.C. 154(b) by 351 days.

(21) Appl. No.: 13/054,222

(22) PCT Filed: Jul. 16, 2009

(86) PCT No.: PCT/JP2009/003364
§ 371 (c)(1),
(2), (4) Date: Jan. 14, 2011

(87) PCT Pub. No.: WO2010/007792
PCT Pub. Date: Jan. 21, 2010

(65) Prior Publication Data
US 2011/0121422 A1    May 26, 2011

(30) Foreign Application Priority Data
Jul. 16, 2008    (JP) ................................ 2008-185419

(51) Int. Cl.
H01L 31/0232    (2006.01)
(52) U.S. Cl.
USPC .................... 257/432; 257/462; 257/E31.127
(58) Field of Classification Search
USPC ................................. 257/432, 462, E31.127
See application file for complete search history.

(56) References Cited

U.S. PATENT DOCUMENTS

| 7,718,949 | B2 * | 5/2010 | Toshikiyo | ...................... 250/216 |
| 2006/0115230 | A1 | 6/2006 | Komoguchi et al. | |
| 2006/0284052 | A1 * | 12/2006 | Toshikiyo et al. | ......... 250/208.1 |
| 2007/0069108 | A1 | 3/2007 | Inaba | |
| 2007/0146531 | A1 | 6/2007 | Toshikiyo | |
| 2007/0155043 | A1 | 7/2007 | Hashimoto | |
| 2008/0011937 | A1 | 1/2008 | Toshikiyo | |
| 2009/0250779 | A1 | 10/2009 | Hirose et al. | |

FOREIGN PATENT DOCUMENTS

| CN | 101098415 | 1/2008 |
| JP | 2869280 | 12/1998 |
| JP | 2006-128383 | 5/2006 |
| JP | 2006-128383 A | 5/2006 |
| JP | 2006-261247 | 9/2006 |
| JP | 2007-173258 | 7/2007 |

(Continued)

OTHER PUBLICATIONS

China Office action, mail date is Mar. 23, 2012.

(Continued)

Primary Examiner — Phat X Cao
(74) Attorney, Agent, or Firm — McDermott Will & Emery

(57) ABSTRACT

A solid-state image sensor having a configuration which reduces increases in light-collection loss and light mixing due to an increase in the angle of light entering into a waveguide path during oblique incidence and which is effective for sensitivity improvement includes: an Si substrate; unit-pixels arranged on the Si substrate; a wiring layer formed on the unit-pixels; optical waveguide regions each formed on a photoelectric conversion region included in a corresponding one of the unit-pixels, and penetrating the wiring layer; and light-collecting elements each formed above a corresponding one of the optical waveguide regions, wherein each of the light-collecting elements is a gradient index microlens having an effective refractive index distribution.

20 Claims, 17 Drawing Sheets

(56) References Cited

FOREIGN PATENT DOCUMENTS

| | | |
|---|---|---|
| JP | 2007-173258 A | 7/2007 |
| JP | 2007-194606 | 8/2007 |
| JP | 2008-10773 | 1/2008 |
| JP | 2008-91800 | 4/2008 |
| JP | 2008-091800 A | 4/2008 |
| JP | 2008-134583 | 6/2008 |
| JP | 2008-134583 A | 6/2008 |
| JP | 2008-185419 | 8/2008 |
| WO | 2005/076361 | 8/2005 |
| WO | 2005/101067 | 10/2005 |

OTHER PUBLICATIONS

Office Action mailed Oct. 23, 2012 issued in corresponding JP Patent Application No. 2008-185419.

* cited by examiner

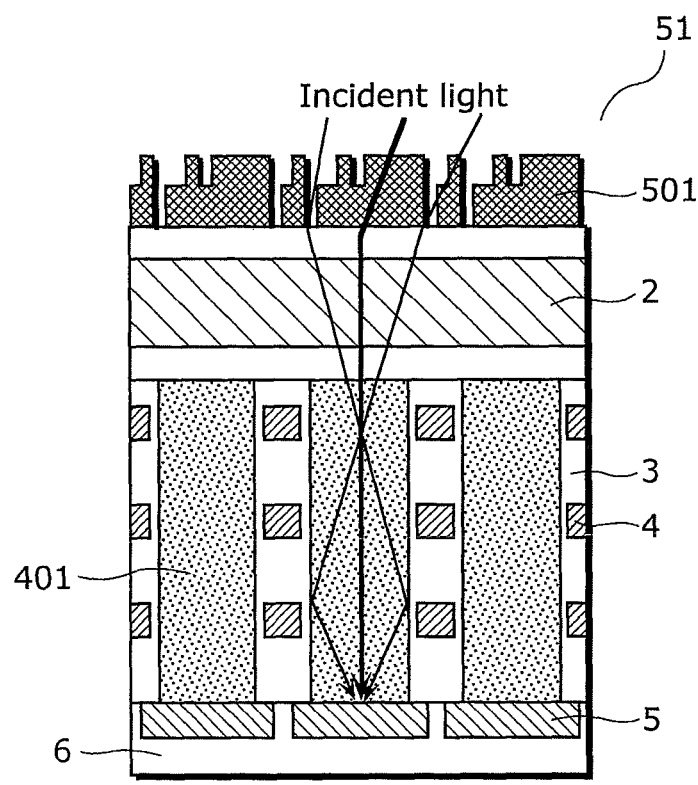

Conventional technique

Present embodiment

Perpendicular incidence

Oblique incidence

Enlarged view

Perpendicular incidence

Oblique incidence

Enlarged view

902

503

404

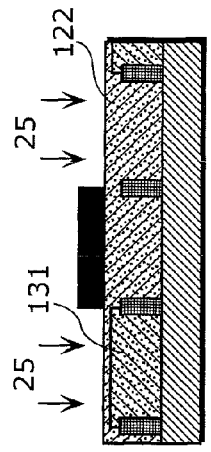
FIG. 18A
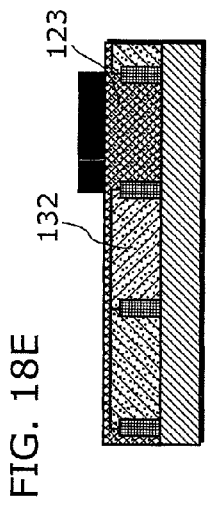
FIG. 18B
FIG. 18C
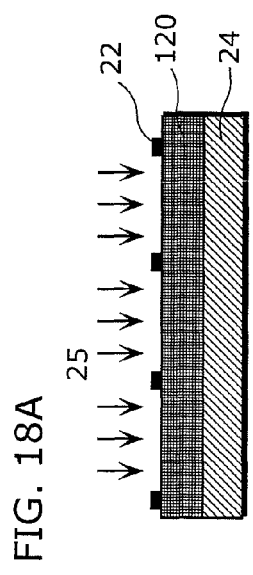
FIG. 18D
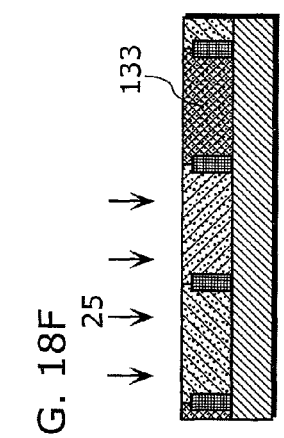
FIG. 18E
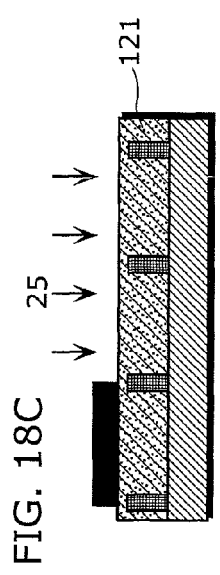
FIG. 18F

SOLID-STATE IMAGE SENSOR

TECHNICAL FIELD

The present invention relates to a solid-state image sensor used in a digital camera and so on.

BACKGROUND ART

Solid-state image sensors such as an MOS sensor and a charge-coupled device (CCD) are provided in digital cameras, mobile phones, and the like, and miniaturization of such sensors, and eventually pixels (cells) is required due to increased demand for high-definition imaging functions and smaller sizing.

FIG. 19 schematically shows a cross-section of a pixel part of a first type of conventional MOS sensor. Photoelectric conversion regions (photodiodes) 102 are formed in the surface of an Si substrate 101, and a wiring layer 104 is formed via an interlayer insulation film 103. Furthermore, a color filter 105 is formed above the interlayer insulator film 103 to allow light of a different color to enter each pixel. In addition, on-chip lenses 106 made from plastic for converging incident light to the photodiodes 102 are provided above the color filter 105. Although the miniaturization of the pixel (cell) itself is necessary in order to respond to the aforementioned requirement, light-collecting efficiency deteriorates with such miniaturization. This problem is caused by the fact that, when the cell size is reduced, the distance from the incidence surface of the on-chip lens 106 to the photoelectric conversion region (photodiode) 102 which is the actual light-receiving unit becomes longer than the focal point distance of the on-chip lens 106, and this focal point distance cannot be lengthened when the cell size is small, that is, light cannot be collected in the photodiode 102.

In order to address such a problem, the above-described first type has been modified into a second type of conventional technique which is provided with a region (hereafter called an optical waveguide region) having an optical waveguide function in which a high-refraction index region covered by a low-refraction index region is formed up to the vicinity of the upper surface of the photodiode and within a distance that allows light-collection by the on-chip lens (see Patent Literature 1). FIG. 20 schematically shows this second type of conventional technique. This second type of has the configuration of the first type of conventional technique shown in FIG. 19 as a basic pattern but includes, in the interlayer insulation film 103 below the color filter 105 and above the photodiodes 102, optical waveguide regions 301 made of a material (for example, SiN) having a higher refraction index than the interlayer insulation film (typically $SiO_2$) 103. By adopting such a configuration, light incident on each of the optical waveguide region 301 is locked inside the optical waveguide region 301 and is wave-guided inside the optical waveguide region 301 to the corresponding photodiode 102. In other word, the light-collection loss due to the on-chip lens 106 having a short focal point distance is reduced. Furthermore, techniques of light-collecting in an optical waveguide region by shrinking the on-chip lens with respect to oblique incident light are disclosed.

Aside from the technique in Patent Literature 1 as described above, various techniques have been presented as the aforementioned second type of conventional technique.

Patent Literature 2 discloses a technique of forming an optical waveguide region on a charge-coupled device.

Patent Literature 3 discloses a technique which relates to the forming of an optical waveguide path in which the optical waveguide region has a 2-stage structure and a high-refraction index material is embedded in each of the stages.

Patent Literature 4 discloses a technique of increasing aperture ratio and improving the light-collecting efficiency for oblique incident light.

CITATION LIST

Patent Literature

[PTL 1] Unexamined Japanese Patent Application Publication No. 2006-261247
[PTL 2] Japanese Patent No. 2869280
[PTL 3] Unexamined Japanese Patent Application Publication No. 2007-173258
[PTL 4] Unexamined Japanese Patent Application Publication No. 2007-194606

SUMMARY OF INVENTION

Technical Field

However, even when the above-described first type as well as the second type of conventional techniques is used, light-collecting efficiency for oblique incident light is low. One of the reasons that can be given for this is the occurrence of light-collection loss or color-mixing within the waveguide path due to an increase in the angle of light entering inside the waveguide path. This is due to the following reason. Specifically, when the refractive index of the optical waveguide region is n1, the refractive index of the medium surrounding the optical waveguide region is n2, and the angle formed by the incident light to the waveguide region and the normal direction is θ, the total reflection condition is given as $\theta < \cos^{-1}(n2/n1)$. However, when θ becomes big, the previous expression can no longer be satisfied, and problems such as light-collection loss or color-mixing within the waveguide path occur.

The present invention has been conceived in view of the aforementioned problem and has as an object to provide a solid-state image sensor that includes a configuration which reduces the increase of light-collection loss and color-mixing due to the increase in the angle of light entering inside the waveguide path during oblique incidence, and which is effective for sensitivity improvement.

Solution to Problem

In order to solve the aforementioned problem, the solid-state image sensor according to the present invention includes: a substrate; unit-pixels arranged on the substrate; a wiring layer formed on the unit-pixels; optical waveguide regions each formed on a photoelectric conversion region included in a corresponding one of the unit-pixels, and penetrating the wiring layer; and light-collecting elements each formed above a corresponding one of the optical waveguide regions, wherein each of the light-collecting elements is a gradient index microlens having an effective refractive index distribution. With such a configuration, a gradient index lens is provided above the optical waveguide region of each pixel, and thus the increase in the angle of light incident on the optical waveguide region can be suppressed and the conventional problem can be solved.

In addition, in order to solve the aforementioned problem, in the solid-state image sensor according to the present invention, each of the light-collecting elements includes a first region having a function for deflecting incident light and a second region having a function for deflecting and collecting incident light. With such a configuration, propagation loss for light incident on the optical waveguide regions can be reduced.

In addition, in order to solve the aforementioned problem, in the solid-state image sensor according to the present invention, the first region having the function for deflecting incident light has a width that is equal to or greater than a wavelength of light incident on the light-collecting element and equal to or less than a width of an aperture of the corresponding one of the optical waveguide regions. With such a configuration, it is possible to suppress the leakage of light incident on the aperture of an optical waveguide region, and, in addition, reduce propagation loss.

In addition, in order to solve the aforementioned problem, in the solid-state image sensor according to the present invention, each of the light-collecting elements has an effective refractive index distribution of a light-transmitting film having concentric structural elements each having a line-width approximately equal to or shorter than the wavelength of incident light. With such a configuration, the effective refractive index distribution can be easily optimized for each unit-pixel, and thus the level of design freedom increases.

In addition, in order to solve the aforementioned problem, in the solid-state image sensor according to the present invention, the optical waveguide regions are of plural types having different light (wavelength) absorption characteristics. The adoption of such a configuration succeeds in the removal of the color filter layer, which is independent of the optical waveguide regions, that is required in the conventional technique, and is thus effective for sensitivity improvement.

In addition, in order to solve the aforementioned problem, in the solid-state image sensor according to the present invention, a high-refractive index medium making up the optical waveguide regions is mainly made of a metal oxide, and particles that are between 5 nm and 100 nm in diameter are further dispersed in the high-refractive index medium, the particles being first metallic inclusion particles which include a metal that is different from a metal included in the metal oxide. By adopting such a configuration, it is possible to realize optical waveguide regions having excellent color-dispersion characteristics brought about by plasmon absorption through the coupling of surface plasmon of particles including metal of a small particle diameter and visible light, and through metal plasmon absorption or metal oxide electron transition absorption.

In addition, in order to solve the aforementioned problem, in the solid-state image sensor according to the present invention, the optical waveguide regions include a first-type optical wave guide region, a second-type optical waveguide region, and a third-type optical waveguide region, the first-type optical waveguide region including at least one of gold, copper, chromium, and iron-chromium oxide as the first metallic inclusion particles, the second-type optical waveguide region including at least one of cobalt-titanium oxide, nickel-titanium-zinc oxide, and cobalt-zinc oxide as the first metallic inclusion particles, and the third-type optical waveguide region including at least one of cobalt-aluminum oxide and cobalt-chromium oxide as the first metallic inclusion particles. By adopting such a configuration, it is possible to realize a transmissive filter mainly of the red color region when the first-type of dispersant particles are used, and realize a transmissive filter mainly of the green color region when the second-type of dispersant particles are used, and realize a transmissive filter mainly of the blue color region when the third-type of dispersant particles are used. Furthermore, by mixing the dispersant particles of the first, second, and third types and selecting the percentages thereof, color characteristics for arbitrary regions can be realized.

In addition, in order to solve the aforementioned problem, in the solid-state image sensor according to the present invention, each of the light-collecting elements has one of plural types of light-dispersion functions that are different depending on a corresponding one of the photoelectric conversion regions, and second metallic inclusion particles which include a metal are dispersed in the light-collecting elements. The adoption of such a configuration succeeds in the removal of the color filter layer, which is independent of the optical waveguide regions, that is required in the conventional technique, and is thus effective for sensitivity improvement.

In addition, in order to solve the aforementioned problem, in the solid-state image sensor according to the present invention, each of the light-collecting elements is a medium which transmits 50% or more of infrared light included in visible light received by the solid-state image sensor having a refractive index of 1.4 or greater, and the medium includes the second metallic inclusion particles that are between 5 nm and 50 nm in diameter. By adopting such a configuration, it is possible to realize optical waveguide regions having excellent color-dispersion characteristics brought about by plasmon absorption through the coupling of surface plasmon of particles including metal of a small particle diameter and visible light, and through metal plasmon absorption or metal oxide electron transition absorption.

In addition, in order to solve the aforementioned problem, in the solid-state image sensor according to the present invention, the light-collecting elements include a first-type light-collecting element, a second-type light-collecting element, and a third-type light-collecting element, the first-type light collecting element including at least one of gold, copper, chromium, and iron-chromium oxide as the second metallic inclusion particles, the second-type light-collecting element including at least one of cobalt-titanium oxide, nickel-titanium-zinc oxide, or cobalt-zinc oxide as the second metallic inclusion particles, and the third-type light-collecting element including at least one of cobalt-aluminum oxide, and cobalt-chromium oxide as the second metallic inclusion particles. By adopting such a configuration, it is possible to realize a transmissive filter mainly of the red color region when the first-type of dispersant particles are used, and realize a transmissive filter mainly of the green color region when the second-type of dispersant particles are used, and realize a transmissive filter mainly of the blue color region when the third-type of dispersant particles are used. Furthermore, by mixing the dispersant particles of the first, second, and third types and selecting the percentages thereof, color characteristics for arbitrary regions can be realized.

Advantageous Effects of Invention

As described above, the present invention, can realize a solid-state image sensor that includes a configuration which reduces the increase of light-collection loss and color-mixing due to the increase in the angle of light incident inside a waveguide during oblique incidence, and which is effective for sensitivity improvement.

BRIEF DESCRIPTION OF DRAWINGS

FIG. 1 shows a structure of a solid-state image sensor according to Embodiment 1.

FIGS. 18A to 18F show a manufacturing process of the solid-state image sensor according to Embodiment 4.

DESCRIPTION OF EMBODIMENTS

Figure 2A:
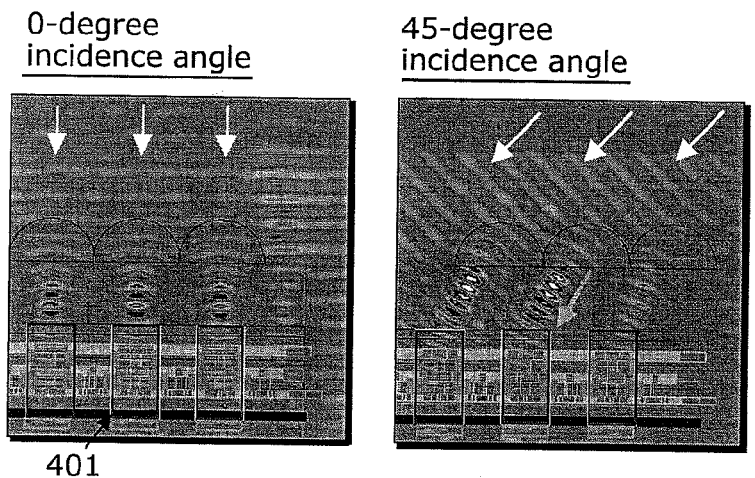
FIGS. 2A and 2B respectively show the light-collecting pattern in the conventional technique and the solid-state image sensor according to Embodiment 1.

Hereinafter, embodiments of the present invention shall be specifically described with reference to the Drawings. It is to be noted that although the present invention shall be described using the following embodiments and the attached Drawings, such description is for the purpose of exemplification and is not intended to limit the present invention thereto. For example, although a light-collecting element (gradient index microlens) is a light-collecting element which has an effective refractive index distribution of a light-transmitting film having concentric structural elements each having a line-width approximately equal to or shorter than the wavelength of incident light, it may also be a Fresnel lens.

Embodiment 1

First, a solid-state image sensor according to a first embodiment (Embodiment 1) of the present invention shall be described.

FIG. 1 is a cross-sectional view of a solid-state image sensor (also called "unit-pixels") 51 according to Embodiment 1. The "□" (square) size of each pixel included in the solid-state image sensor 51 is, for example, 1.75 μm square, and the solid-state image sensor 51 is includes light-collecting elements (gradient index microlenses) 501, a color filter 2, an interlayer insulation film 3, a wiring layer 4, photoelectric conversion regions (Si photodiodes) 5, and an Si substrate 6. Optical waveguide regions (optical waveguide paths) 401 are formed penetrating the wiring layer 4, in the interlayer insulation film 3 above each of the photoelectric conversion regions 5. Here, each of the optical waveguide regions 401 is formed from SiN (n=2.0 (n is the refractive index)) which is a light-transmitting film, each of the light-collecting elements 501 is of a structure in which a concentric ring-pattern is engraved in $SiO_2$ (n=1.45) which is a light-transmitting film, and the surrounding medium is air (n=1.00). Furthermore, the film-thickness of $SiO_2$ is, for example, 1.2 μm. Specifically, the light-collecting element 501 is a gradient index microlens having an effective refractive index distribution of a light-transmitting film having a concentric structural elements each having a line-width approximately equal to or shorter than the wavelength of incident light. Here, a gradient index microlens is a microlens having a refractive index that changes depending on the distance from the light axis of the lens.

Figure 2B:
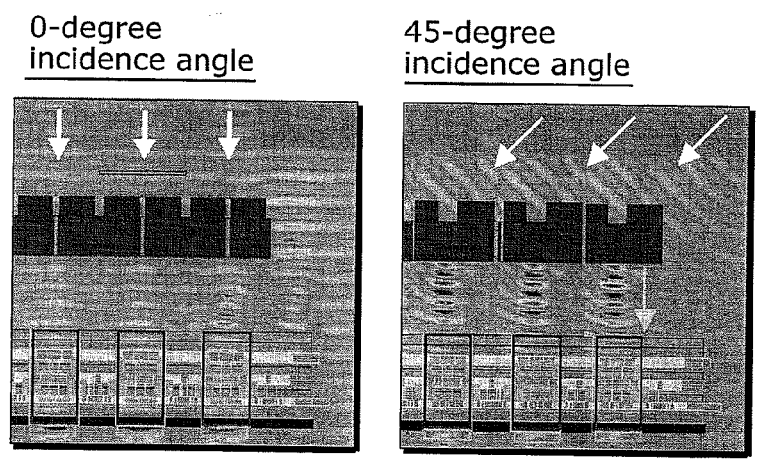

FIGS. 2A and 2B show light propagation simulation results for a solid-state image sensor according to the conventional technique and the solid-state image sensor according to Embodiment 1, respectively. Here, light propagation directions when the incidence angles are 0 degrees (left diagram) and 45 degrees (right diagram) are shown. In the solid-state image sensor in the conventional technique (FIG. 2A), light incident at an incidence angle of 45 degrees enters obliquely into an optical waveguide region (right-side diagram in FIG. 2A), whereas in the solid-state image sensor in the present embodiment (FIG. 2B), light incident at an incidence angle of 45 degrees enters an optical waveguide region while traveling in a nearly straight line (right-side diagram in FIG. 2B). In other words, as shown in FIG. 2A, in a conventional solid-state image sensor equipped with on-chip lenses, the angle of light incident on an optical waveguide region also increases when the incidence angle increases. With this, propagation loss within the optical waveguide region occurs. In contrast, as shown in FIG. 2B, even when the incidence angle increases, the solid-state image sensor 51 according to the present invention can reduce the angle of incidence to the optical waveguide region 401 and thus reduce propagation loss.

Figure 3:
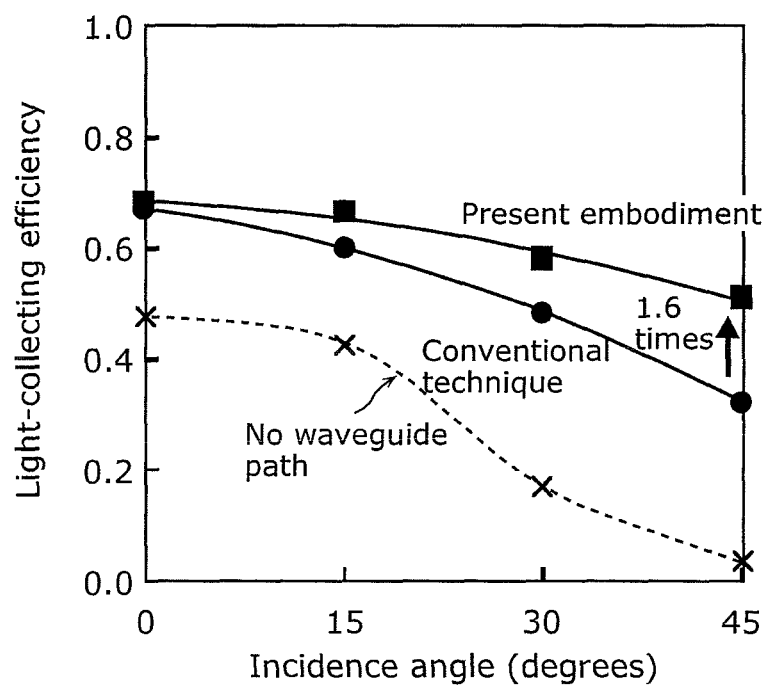
FIG. 3 shows the light-collecting characteristics of the conventional technique and the solid-state image sensor according to Embodiment 1.

FIG. 3 is a graph showing the light-collecting efficiency of the solid-state image sensor 51 according to Embodiment 1. Furthermore, the light-collecting efficiency of a conventional structure is also shown for comparison. Here, light-collecting efficiency is a value obtained by dividing the amount of light incident on a photoelectric conversion region by the amount of light incident on the corresponding unit-pixel. The horizontal axis in FIG. 3 indicates the angle θ (degrees) of incident light, and the vertical axis indicates the light-collecting efficiency. FIG. 3 shows that, in the solid-state image sensor 51 according to Embodiment 1, light-collecting efficiency is higher than in the conventional structure across the entire band of incidence angles from 0 to 45 degrees, and that light-collecting efficiency is significantly improved to approximately 1.6 times that of the conventional structure when the incidence angle is 45 degrees. It should be noted that the focal point distance of each light-collecting element 501 is set near the center in the optical waveguide region. With this, it is possible to minimize the angle of light incident on the waveguide path region, and obtain high light-collecting efficiency.

FIGS. 4A to 4B and FIGS. 5A to 5F are diagrams each showing a manufacturing process of the optical waveguide region 401 and the light-collecting element 501 according to Embodiment 1. It should be noted that FIGS. 5A to 5F only illustrate the upper-layer portion (upper layers from the color filter 2) of the solid-state image sensor 51 according to Embodiment 1.

First, the photoelectric conversion regions 5, the interlayer insulation film 3, and the wiring layer 4 are formed above the Si substrate 6 using the normal semiconductor process (details are not illustrated in FIG. 4). Furthermore, these shall be referred to using the abbreviated name semiconductor integrated circuit 8.

Figure 4A:
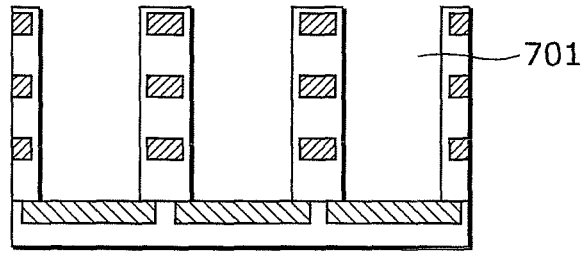
FIGS. 4A to 4D show a manufacturing process of the solid-state image sensor according to Embodiment 1.
Figure 4B:
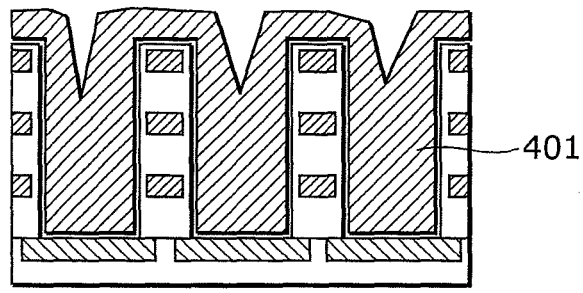
Figure 4C:
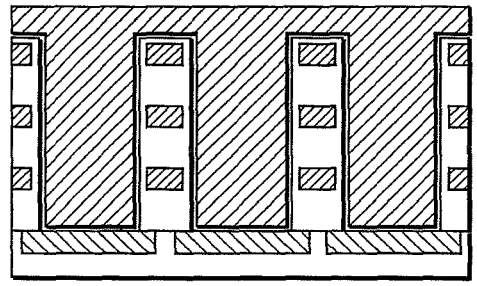
Figure 4D:
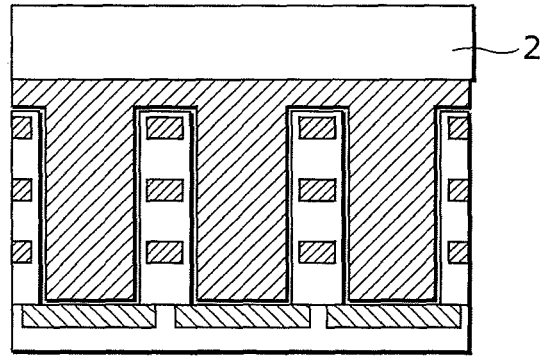

Next, as shown in FIG. 4A, an aperture 701 is formed in an optical waveguide region 401-forming region above the photoelectric conversion region 51 of each unit-pixel, by dry-etching. Subsequently, an optical waveguide path medium SiN film is formed using a CVD apparatus (FIG. 4B). After completely filling the aperture 701 with the optical waveguide path medium, the surface layer is removed by surface polishing, and the optical waveguide region 401 is completed as shown in FIG. 4C. Subsequently, the color filter 2 is formed using the normal semiconductor process (FIG. 4D).

Figure 5A:
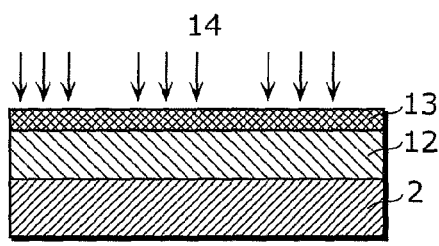
FIGS. 5A to 5F show (a continuation of) the manufacturing process of the solid-state image sensor according to Embodiment 1.
Figure 5D:
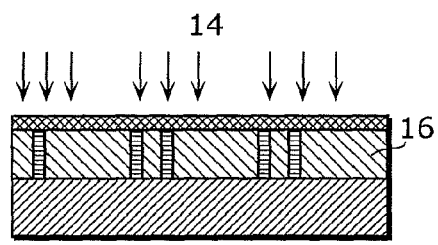
Figure 5B:
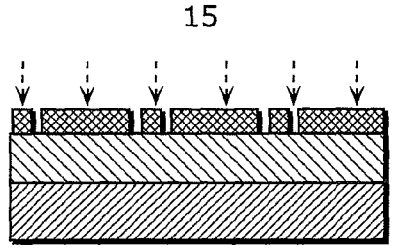
Figure 5E:
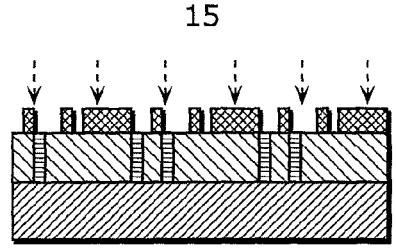
Figure 5C:
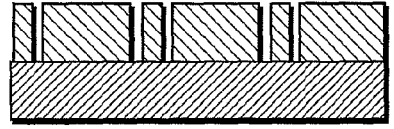
Figure 5F:
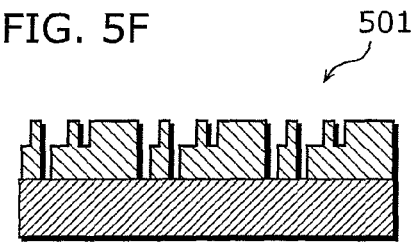

Next, in order to form the light-collecting element 501, first, a SiO$_2$ film 12 is formed on the color filter 2 using a CVD apparatus, and a resist (light-transmitting film) 13 is applied on the SiO$_2$ film 12 (FIG. 5A). Subsequently, patterning is performed using light exposure 14 (FIG. 5B). The thickness of the SiO$_2$ film and the resist is 1.2 μm and 0.5 μm, respectively. After developing, etching 15 is performed to form a concentric ring-structure in the pixel surface (FIG. 5C). After removing the resist, a bottom anti-reflective coating (BARC) material is embedded and flattened (FIG. 5D). After a resist is applied, patterning is performed using the light exposure 14 again (FIG. 5E). After etching, the light-collecting element 501 can be formed by removing the resist and the BARC material (FIG. 5F).

It should be noted that, since the structure is a minute structure in which concentric structural elements each have a line width of approximately 0.1 μm, a phase mask is used in a photolithography process in the manufacturing process of the light-collecting element 501 according to Embodiment 1 described above. This allows the resist patterning width (pitch) to be controlled with high precision.

As described above, in the solid-state image sensor in the present embodiment, a refractive index distribution lens is provided above the optical waveguide region of each pixel, and thus the increase in the angle of light incident on a waveguide region is suppressed and, as a result, a solid-state image sensor that includes a configuration which reduces the increase in light-collection loss and color-mixing and which is effective for sensitivity improvement is realized.

Embodiment 2

Next, a solid-state image sensor according to a second embodiment (Embodiment 2) of the present invention shall be described.

Figure 6:
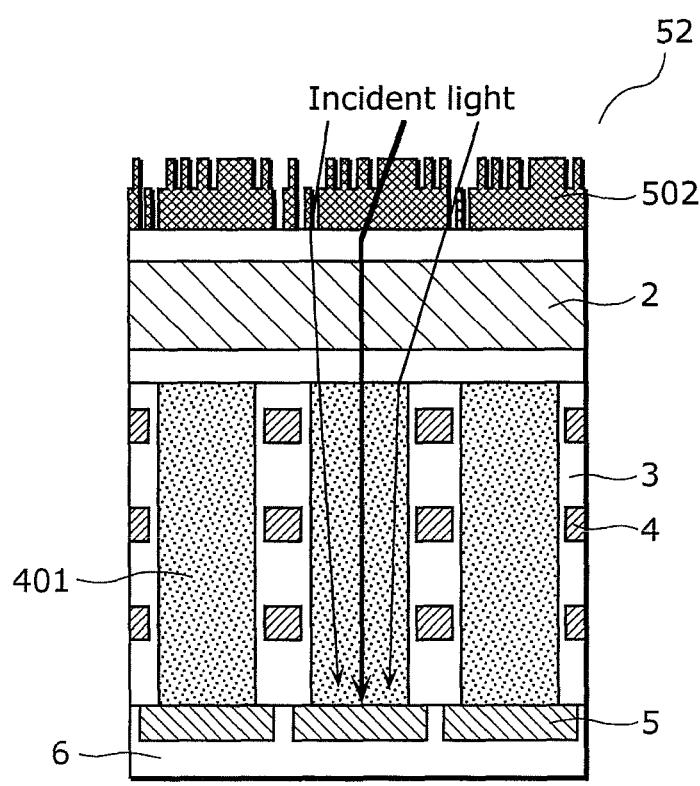
FIG. 6 shows a structure of a solid-state image sensor according to Embodiment 2.

FIG. 6 is a cross-sectional view of a solid-state image sensor (also called "unit-pixels") 52 according to Embodiment 2. The "□" size of each pixel included in the solid-state image sensor 52 is, for example, 1.75 μm square, and the solid-state image sensor 52 includes light-collecting elements (gradient index microlenses) 502, the color filter 2, the interlayer insulation film 3, the wiring layer 4, the photoelectric conversion regions (Si photodiodes) 5, and the Si substrate 6. The optical waveguide regions (optical waveguide paths) 401 are formed penetrating the wiring layer 4, in the interlayer insulation film 3 above each of the photoelectric conversion regions 5. Here, each of the optical waveguide regions 401 is formed from SiN (n=2.0) which is a light-transmitting film, each of the light-collecting elements 502 is of a structure in which a concentric ring-pattern is engraved in SiO$_2$ (n=1.45) which is a light-transmitting film, and the surrounding medium is air (n=1.00). Furthermore, the film-thickness of SiO$_2$ is, for example, 1.2 μm. Specifically, the light-collecting element 502 is a gradient index microlens having an effective refractive index distribution of a light-transmitting film having concentric structural elements each having a line-width approximately equal to or shorter than the wavelength of incident light.

Figure 7A:
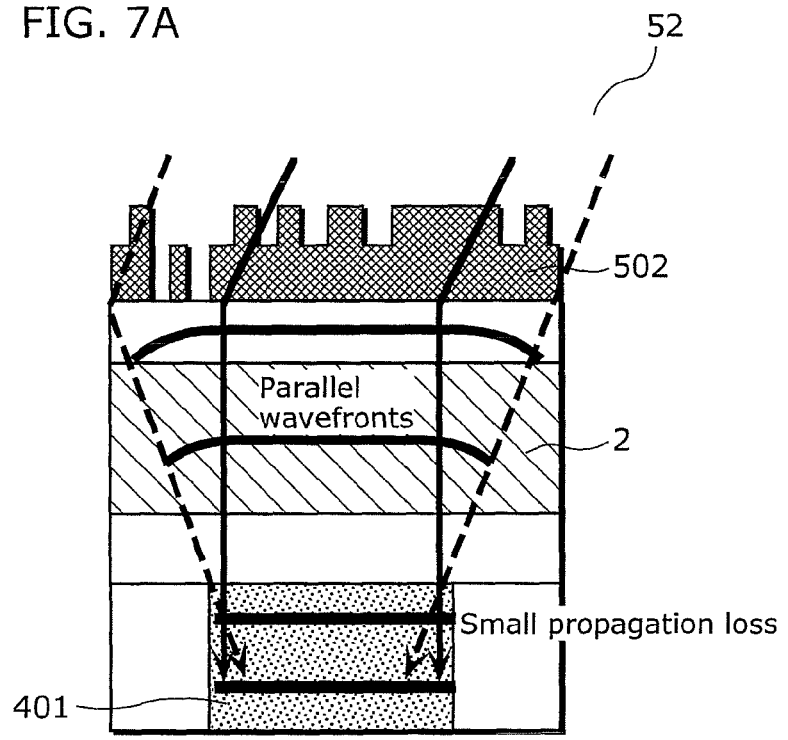
FIGS. 7A and 7B show the structure and the refractive index distribution of a light-collecting element in Embodiment 2.
Figure 7B:
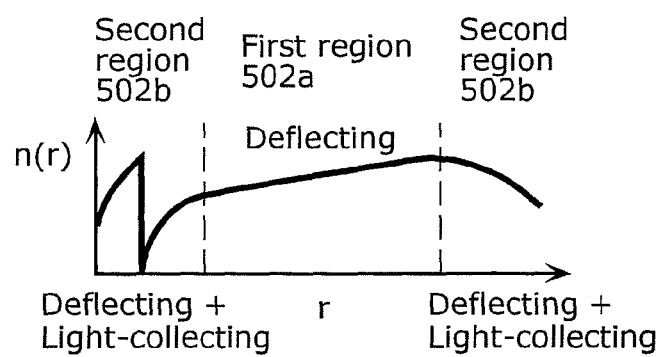

FIGS. 7A and 7B is a cross-sectional view and a refraction index graph, respectively, of the light-collecting element 502 formed in the solid-state image sensor 52 according to Embodiment 2. As can be seen from the wavefronts shown in FIG. 7A, the light-collecting element 502 according to Embodiment 2 includes a first region 502a having a function for deflecting incident light and a second region 502b having a function for deflecting and collecting incident light (FIG. 7B). As shown in FIG. 7B, the first region 502a is a region having a width that is greater than the wavelength of light incident on the light-collecting element 502 and less than the aperture width of the optical waveguide region 401. Here, the refractive index distribution n(r) of the light-collecting element 502 can be defined using the equation below.

Specifically, the refractive index distribution n(r) of the first region 502a can be defined using the equation below.

(Equation 1)

$$n(r) = n_0 + \frac{\Delta n_{max}}{2\pi}\left(B\left(r + \frac{D}{2}\right)\sin\theta + C\right) \quad \text{[Math 1]}$$

Furthermore, the refractive index distribution n(r) of the second region 502b can be defined using the equation below.

(Equation 2)

$$n(r) = n_0 + \frac{\Delta n_{max}}{2\pi}\left(A\left(r \pm \frac{D}{2}\right)^2 + B\left(r + \frac{D}{2}\right)\sin\theta + C\right) \quad \text{[Math 2]}$$

However, (Equation 3)

$$A = -\frac{k_0 n_1}{2f} \quad B = -k_0 n_0 \quad C = -\frac{k_0 n_0^2 f \sin^2\theta}{2n_1} \quad \text{[Math 3]}$$

Here, $K_0$ denotes the frequency, f denotes the focal point distance, $n_0$ denotes the refractive index of the entrance-side medium, $n_1$ denotes the refractive index of the exit-side medium, $\Delta n_{max}$ denotes the refractive index difference for the light-transmitting film, θ denotes the incidence angle, and D denotes the aperture width of the optical waveguide region. It should be noted that, Equation 1 and Equation 2 respectively show that the term defined by the quadric of the distance r from the center of the pixel is the light-collection component, and the term defined by the trigonometric function with r is the deflection component.

Here, as shown in Equation 1, in the first region 502a having the function for deflecting incident light, the refractive index distribution n(r) is represented only by the primary expression of r, and the light-collection component is 0. With this, the light incident on the first region is not collected and becomes parallel wavefronts. Furthermore, by having the refractive index distribution n(r) have a slope that is proportional to sine with respect to the angle θ of the incident light, it is possible to deflect the incident light while maintaining the parallel wavefronts.

Figures 8A, 8B, 8C, 8D, 8E, 8F:
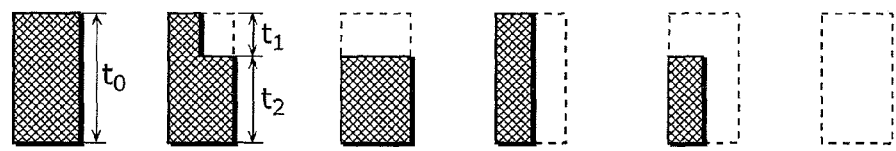
FIGS. 8A to 8F show a basic structures forming the refractive index distribution of the light-collecting elements according to Embodiment 2.

FIGS. 8A to 8F show basic patterns (basic structures) of the volume ratio between the high-refractive index material and the low-refractive index material in each zone region of a two-staged concentric ring-structure making up the light-collecting element 502. FIG. 8A is the densest structure, that is, the structure in which the effective refractive index is highest, and the effective refractive index decreases going from FIG. 8B to 8F. At this time, a top-stage film-thickness t1 on the light entrance-side and the bottom-stage film-thickness t2 on the substrate-side are 0.4 µm and 0.8 µm, respectively, and the film-thickness ratio (top-stage/bottom-stage) is 0.5. Here, the effective refractive index can be controlled by changing the above-described volume ratio. For example, when the volume ratio is made high, the volume decrease in the high-refractive index material due to the change in the basic structures (FIGS. 8A→8F) is large, and thus the decrease in the refractive index in a region having a high effective refractive index becomes big. On the other hand, when the volume ratio is made low, the volume decrease in the high-refractive index material is small, and thus the decrease in the refractive index in a region having a low effective refractive index becomes big.

It should be noted that although basic structures such as those shown in FIGS. 8A to 8F are given as an example in order to facilitate description in the present embodiment, other basic structures may also be used. For example, it is also possible to use a convex basic structure combining the structure shown in FIG. 8B and the structure shown in FIG. 8C, or a concave structure combining the structure shown in FIG. 8B and the structure shown in FIG. 8D. At this time, when these are adopted as the basic structure in a region that is about half the wavelength of incident light, the same light-collecting characteristics can be obtained.

Figure 9:
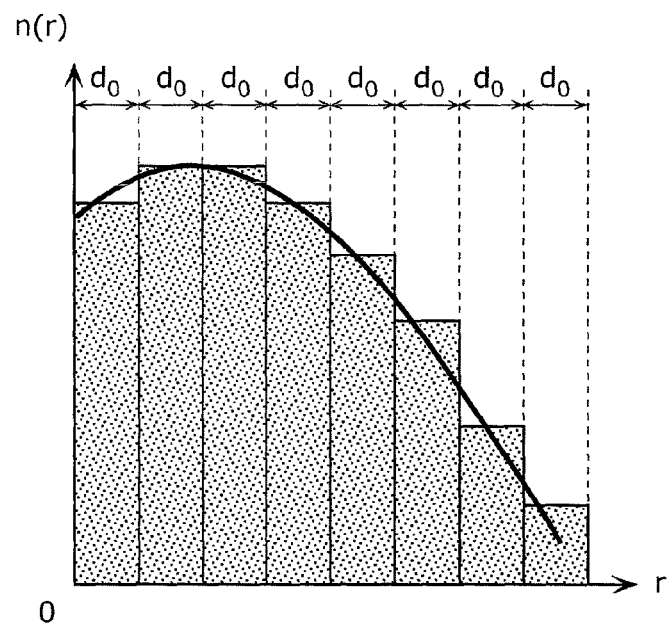
FIG. 9 shows discretization of the refractive index distribution of the light-collecting elements according to Embodiment 2.

Here, the parabolas shown in Equation 1 and Equation 2 are of course consecutive, and are ideal refractive index distributions. However, in an actual minute optical system (submicron region), it is extremely difficult to form consecutive distributions, and the process load is extremely large. The present invention succeeds in obtaining the same advantageous effect by performing discretization on a region that is equal to or less than half of the incident light wavelength. For example, as shown in FIG. 9, discretization of the refractive index distribution is performed at a constant pitch (that is, a line width d0). With this, the line width of the basic structures can be made constant, and the process condition becomes identical between pixels. As a result, it is possible to increase process facilitation and precision.

Figure 10A:
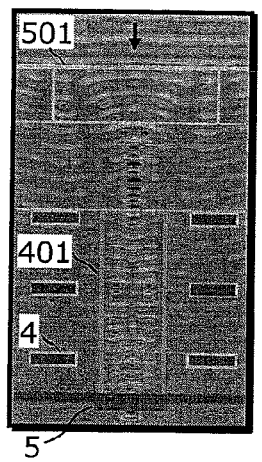
FIGS. 10A to 10F show the light-collecting patterns of the solid-state image sensors according to Embodiments 1 and 2.
Figure 10B:
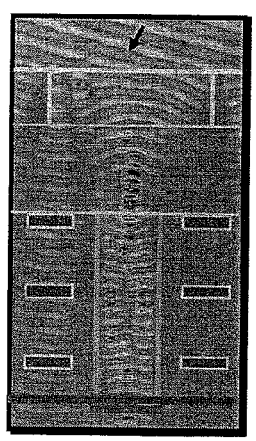
Figure 10C:
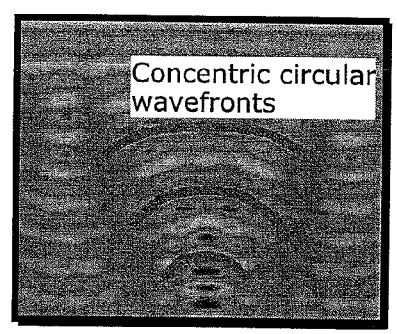
Figure 10D:
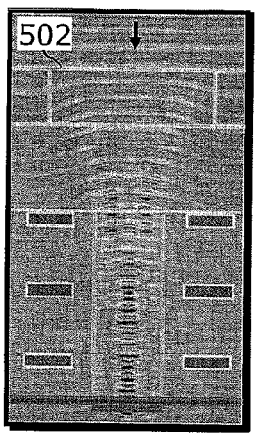
Figure 10E:
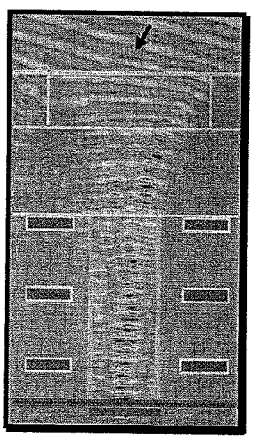
Figure 10F:
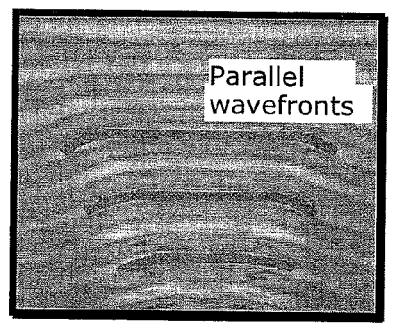

FIGS. 10A to 10F show light propagation simulation results for the solid-state image sensor 52 according to Embodiment 2. Here, the results for the solid-state image sensor 51 in Embodiment 1 is also shown for comparison. FIGS. 10A to 10C show light propagation when light enters perpendicularly and light propagation when light enters obliquely in the solid-state image sensor 51 in Embodiment 1, and an enlarged view of the wavefronts in the light-collecting element 501, respectively. FIGS. 10D to F show light propagation when light enters perpendicularly and the light propagation when light enters obliquely in the solid-state image sensor 52 in Embodiment 2, and an enlarged view of the wavefronts in the light-collecting element 502. As shown in FIG. 10C, in the solid-state image sensor 51 in Embodiment 1, light is propagated within the waveguide path region in the form of concentric circles, and thus reflections are repeatedly propagated within the optical waveguide region 401. With this, propagation loss within the optical waveguide region 401 occurs. In contrast, as shown in FIG. 10F, in the solid-state image sensor 52 according to Embodiment 2, light propagation within the optical waveguide region 401 is in nearly-parallel form, and thus propagation loss can be reduced.

Figure 11:
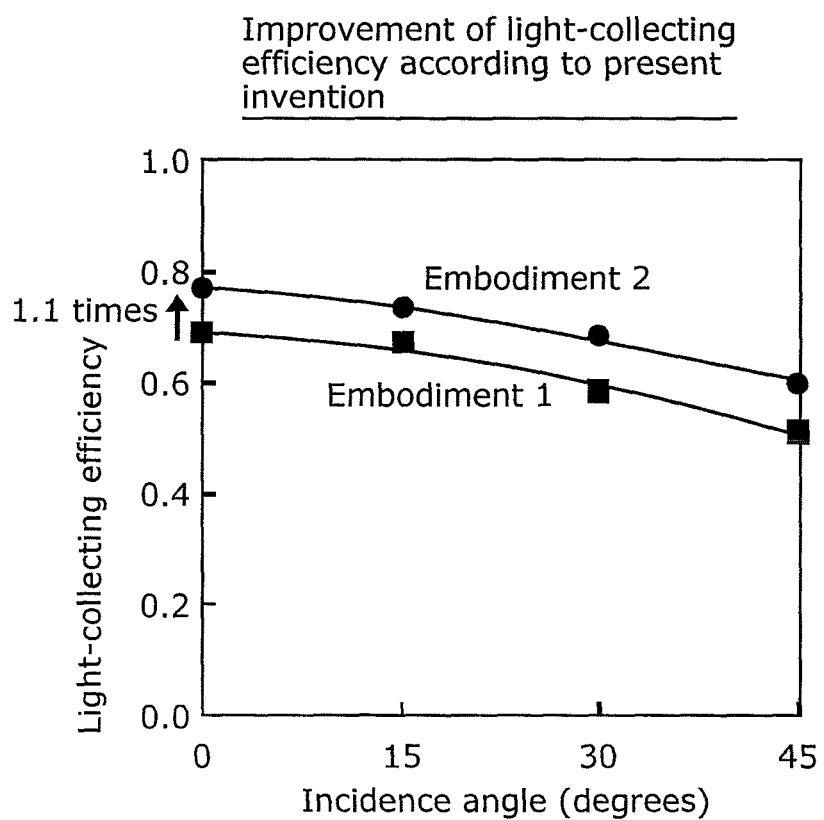
FIG. 11 shows the light-collecting characteristics of the solid-state image sensors according to Embodiments 1 and 2.

FIG. 11 is a graph showing the light-collecting efficiency of the solid-state image sensor 52 according to Embodiment 2. Furthermore, the light-collecting efficiency for Embodiment 1 is also shown for comparison. FIG. 11 shows that, in the solid-state image sensor 52 according to Embodiment 2, light-collecting efficiency is higher than that in Embodiment 1 across the entire band of incidence angles from 0 to 45 degrees, and that light-collecting efficiency is improved by 1.2 times compared to Embodiment 1 when the incidence angle is 0 degrees.

As described above, in the solid-state image sensor in the present embodiment, a light-collecting element which is a refractive index distribution lens is provided above the optical waveguide region of each pixel, and in addition, such light-collecting element includes a first region having a function for deflecting incident light and a second region having a function for deflecting and collecting incident light. With this, propagation loss for light incident on the optical waveguide region is further reduced.

Embodiment 3

Next, a solid-state image sensor according to a third embodiment (Embodiment 3) of the present invention shall be described.

Figure 12:
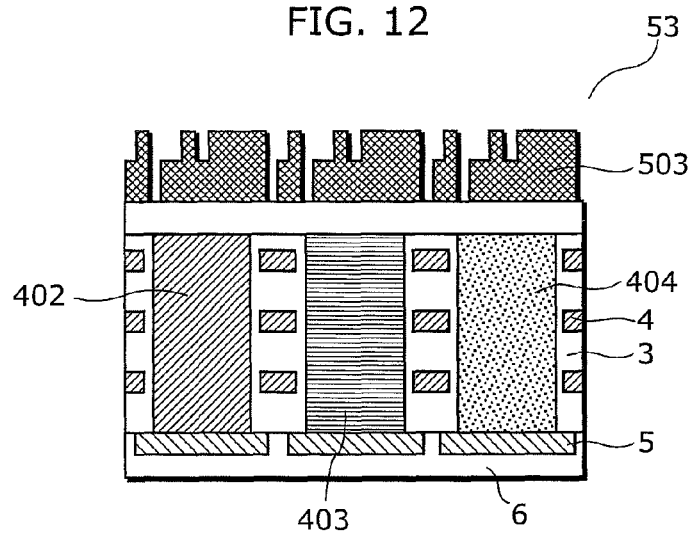
FIG. 12 shows a structure of a solid-state image sensor according to Embodiment 3.

FIG. 12 is a cross-sectional view of a solid-state image sensor (also called "unit-pixels") 53 according to Embodiment 3. The "☐" size of each pixel included in the solid-state image sensor 53 is, for example, 1.75 µm square, and the solid-state image sensor 53 includes light-collecting elements (gradient index microlenses) 503, the interlayer insulation film 3, the wiring layer 4, the photoelectric conversion regions (Si photodiodes) 5, and the Si substrate 6. Each of the light-collecting elements 503 is a gradient index microlens having an effective refractive index distribution of a light-transmitting film having concentric structural elements each having a line-width approximately equal to or shorter than the wavelength of incident light.

Plural types of optical waveguide regions (optical waveguide paths) having different light (wavelength) absorption characteristics are formed penetrating the wiring layer 4, in the interlayer insulation film 3 above each of the photoelectric conversion regions 5. Specifically, an optical waveguide region (optical waveguide path) 402 which transmits red color wavelength region light and absorbs light of other wavelength regions, an optical waveguide region (optical waveguide path) 403 which transmits green color wavelength region light and absorbs light of other wavelength regions, and an optical waveguide region (optical waveguide path) 404 which transmits blue color wavelength region light and absorbs light of other wavelength regions are formed. Here, each of the optical waveguide regions (optical waveguide paths) 402, 403, and 404 (i) is of an organic polymer resin medium having a refractive index (for example, 1.85) that is higher than the refractive index (1.45) of the SiO$_2$ making up the surroundings of the optical waveguide region, and (ii) transmits 50% or more of the light in each received-light wavelength region. In the present embodiment, gold particles of a 5 nm to 50 nm (median value: 15 nm) particle diameter distribution, cobalt-titanium-nickel-zinc oxide of a 5 nm to 50 nm (median value: 25 nm) particle diameter distribution, and cobalt-aluminum oxide of a 5 nm to 50 nm (median value: 20 nm) particle diameter distribution are dispersed, as dispersant particles, in the red color wavelength-transmitting optical waveguide region 402, the green color wavelength-transmitting optical waveguide region 403, and the blue color wavelength-transmitting optical waveguide region 404, respectively. It should be noted that the high-refractive index medium making up each of the optical waveguide regions (optical waveguide paths) 402, 403, and 404 may be made of metal oxide. In such a case, particles of a 5 nm to 100 nm particle diameter, which are metallic inclusion particles including a metal that is different from the metal included in the metal oxide, are dispersed in such refractive index medium.

Here, each of the optical waveguide regions 402, 403, and 404 includes metal particles and thus shows some conductivity (10 kΩ to 1MΩ). Therefore, it is preferable that each of the optical waveguide regions 402, 403, and 404 be insulated from the wiring layer 4 via the interlayer insulation layer 3. Furthermore, it is even more preferable that each of the optical waveguide regions 402, 403, and 404 be insulated from the photoelectric conversion region 5. The present embodiment adopts a configuration in which (i) each of the optical waveguide regions 402, 403, and 404 and (ii) the wiring layer 4 and the photoelectric conversion regions 5 are mediated by the interlayer insulation film 3.

Figure 13:
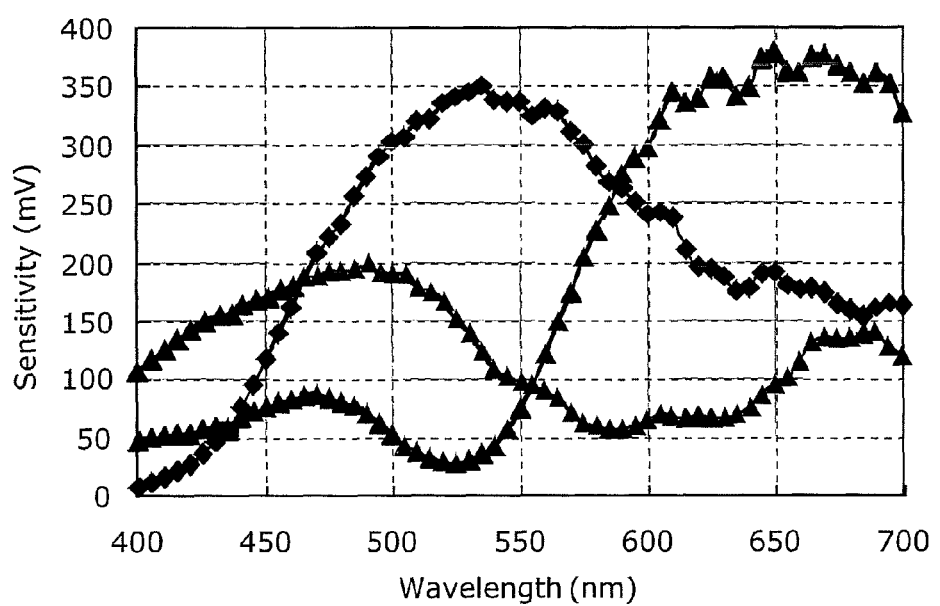
FIG. 13 shows the light-dispersion characteristics of solid-state image sensors according to Embodiments 3 and 4.

The light-receiving sensitivity characteristics of the solid-state image sensor 53 according to the present embodiment is shown in FIG. 13. The figure shows the light-receiving sensitivity characteristics (three curves) of the respective photoelectric conversion regions 5 corresponding to each of the optical waveguide regions 402, 403, and 404. As can be seen from the three curves, with the present embodiment, it is possible to realize excellent color-separation characteristics in the red color region, the green color region, and the blue color region. It should be noted that the characteristics shown in the figure is also the light-receiving sensitivity characteristics for a solid-state image sensor in Embodiment 4 to be described later.

Figure 14:
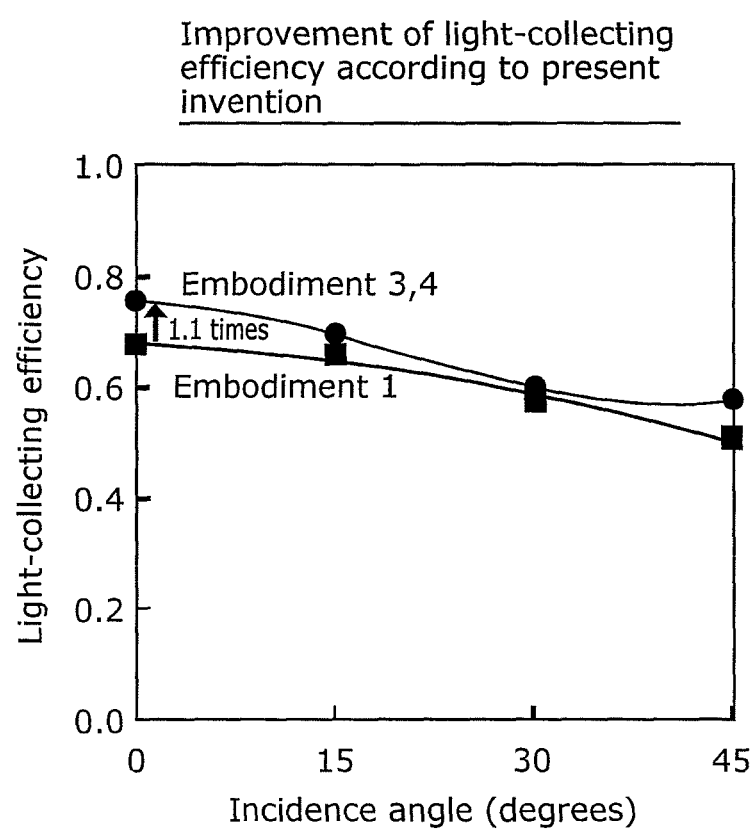
FIG. 14 shows the light-collecting characteristics of solid-state image sensors according to Embodiments 3 and 4.

FIG. 14 is a graph showing the light-collecting efficiency of the solid-state image sensor 53 according to Embodiment 3. Here, the light-collecting efficiency for Embodiment 1 is also shown for comparison. Here, light-collecting efficiency is a value obtained by dividing the amount of light incident on a photoelectric conversion region by the amount of light incident on the corresponding unit-pixel. FIG. 14 shows that, in the solid-state image sensor 53 according to Embodiment 3, light-collecting efficiency is higher than in the solid-state image sensor shown in Embodiment 1 across the entire band of incidence angles from 0 to 45 degrees, and that light-collecting efficiency is improved approximately 1.1 times when the incidence angle is 45 degrees. As described above, the solid-state image sensor 53 according to Embodiment 3 narrows the distance between a light-collecting element and an optical waveguide region by as much as the film-thickness of the color filter, and thus realizes improved sensitivity. It should be noted that, since the light-collecting efficiency of the solid-state image sensor in the present embodiment is the same as that in Embodiment 4 to be described later, the present figure also shows the light-collecting efficiency of the solid-state image sensor in Embodiment 4.

FIGS. 15A to 15F and FIGS. 16A to 16D are diagrams each showing a manufacturing process of the optical waveguide regions according to Embodiment 3. First, the photoelectric conversion regions 5, the interlayer insulation film 3, and the wiring layer 4 are formed above the Si substrate 6 using the normal semiconductor process (details are not illustrated in FIG. 15).

Figure 15A:
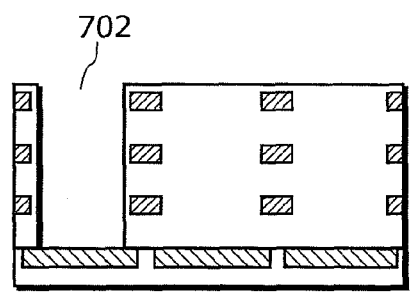
FIGS. 15A to 15F show a manufacturing process of the solid-state image sensor according to Embodiment 3.

Next, as shown in FIG. 15A, an aperture 702 is formed in a red color transmitting waveguide path-forming region above the photodiode of a red color pixel, by dry-etching. Next, after a host resin medium and a solvent in which gold particles are dispersed are applied by spin-coating (FIG. 15B), sintering at 200 degrees Celsius is performed. Since the aspect ratio of the aperture 702 is high, this process is repeated twice and, after completely filling the aperture 702 with sintered object, the surface layer is removed by surface polishing, and the red color transmissive optical waveguide region 402 is completed as shown in FIG. 15(c).

Figure 15D:
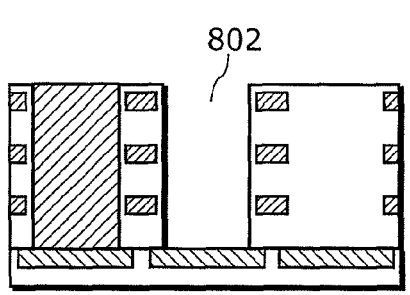
Figure 15B:
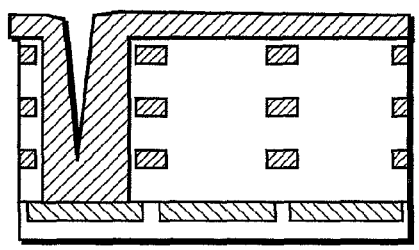
Figure 15E:
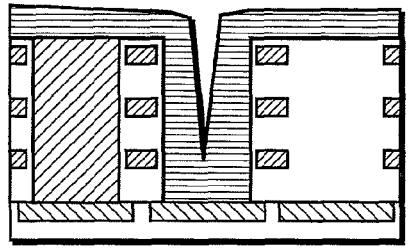
Figure 15C:
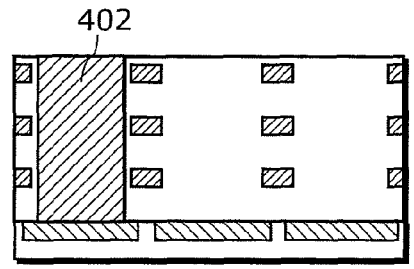
Figure 15F:
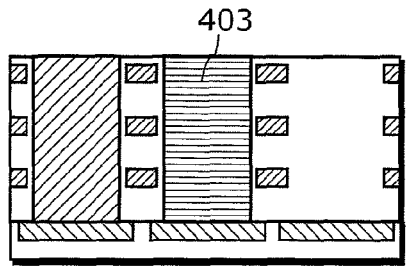

In the same manner, as shown in FIG. 15D, an aperture 802 is formed in a green color transmitting waveguide path-forming region above the photodiode of a green color pixel, by dry-etching. Next, after a host resin medium and a solvent in which cobalt-titanium-nickel-zinc oxide of a 5 nm to 50 nm (median value: 25 nm) particle diameter distribution is dispersed are applied by spin-coating (FIG. 15E), sintering at 200 degrees Celsius is performed. Since the aspect ratio of the aperture 802 is high, this process is repeated twice and, after completely filling the aperture 802 with sintered object, the surface layer is removed by surface polishing, and the green color transmissive optical waveguide region 403 is completed as shown in FIG. 15F.

Figure 16A:
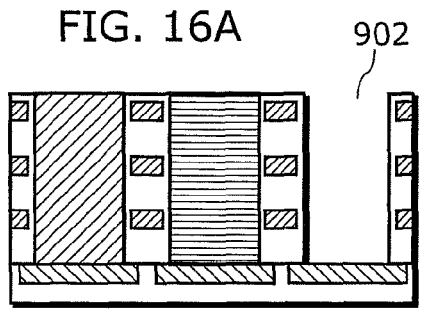
FIGS. 16A to 16D show (a continuation of) the manufacturing process of the solid-state image sensor according to Embodiment 3.
Figure 16B:
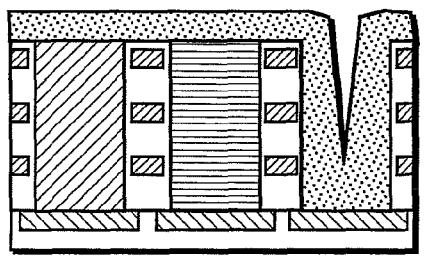

In the same manner, as shown in FIG. 16A, an aperture 902 is formed in a blue color transmitting waveguide path-forming region above the photodiode of a blue color pixel, by dry-etching. Next, after a host resin medium and a solvent in which cobalt-aluminum oxide of a 5 nm to 50 nm (median value: 20 nm) particle diameter distribution is dispersed are applied by spin-coating (FIG. 16B), sintering at 200° C. is performed. Since the aspect ratio of the aperture 702 is high, this process is repeated twice and, after completely filling the aperture 902 with sintered object, the surface layer is removed by surface polishing, and the blue color transmissive optical waveguide region 404 is completed as shown in FIG. 16C.

Figure 16D:
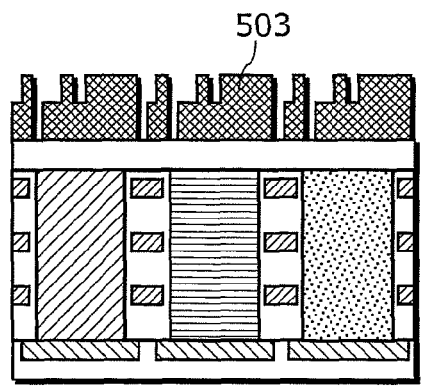
Figure 16C:
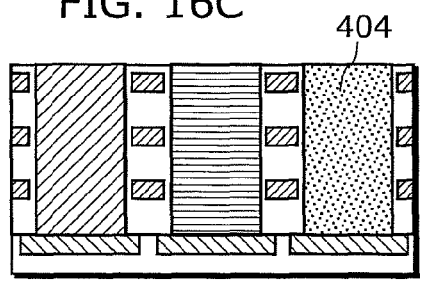

Next, as shown in FIG. 16D, interlayer insulation film 3 is formed in the top-most surface and, after flattening of the surface, the light-collecting elements 503 are formed in the same manner as in Embodiment 1.

As described above, in the solid-state image sensor in the present embodiment, in addition to the features in Embodiment 1, the optical waveguide regions consist of plural types having different light (wavelength) absorption characteristics. With this, a color filter layer, which is independent of the optical waveguide regions, that is required in the conventional technique becomes unnecessary, and the advantageous effect of further improving sensitivity is produced in addition to the advantageous effect in Embodiment 1.

It should be noted that, aside from gold, the optical waveguide region 402 which transmits the red color wavelength may include, as the dispersant particles, particles including at least one of gold, copper, chromium, and iron-chromium oxide. Likewise, aside from cobalt-titanium oxide, the optical waveguide region 403 which transmits the green color wavelength may include, as the dispersant particles, particles including at least one of cobalt-titanium oxide, nickel-titanium-zinc oxide, and cobalt-zinc oxide. Likewise, aside from cobalt-aluminum oxide, the optical waveguide region 404 which transmits the blue color wavelength may include, as the dispersant particles, particles including at least one of cobalt-aluminum oxide and cobalt-chromium oxide.

Embodiment 4

Next, the solid-state image sensor according to a fourth embodiment (Embodiment 4) of the present invention shall be described.

Figure 17:
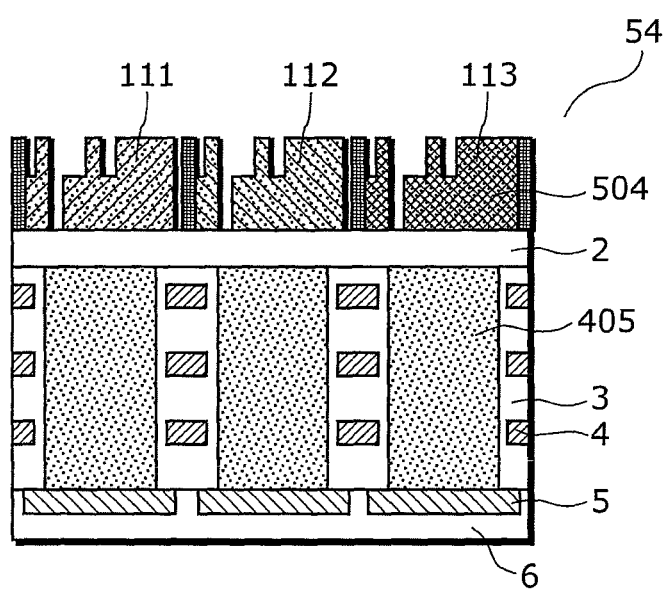
FIG. 17 shows a structure of a solid-state image sensor according to Embodiment 4.
Figure 19:
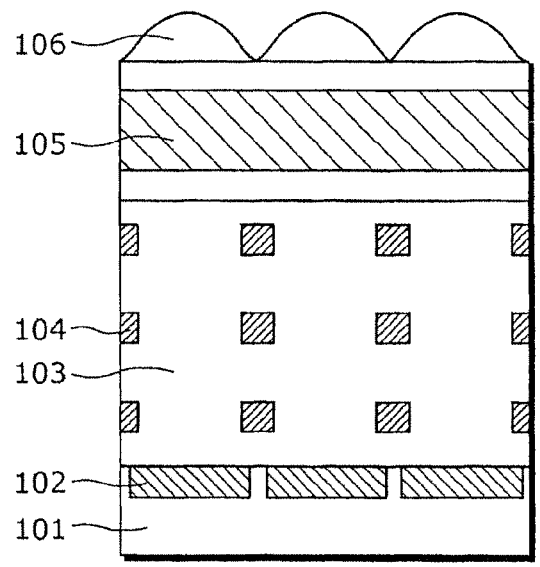
FIG. 19 shows an example of the basic structure of typical conventional pixels.
Figure 20:
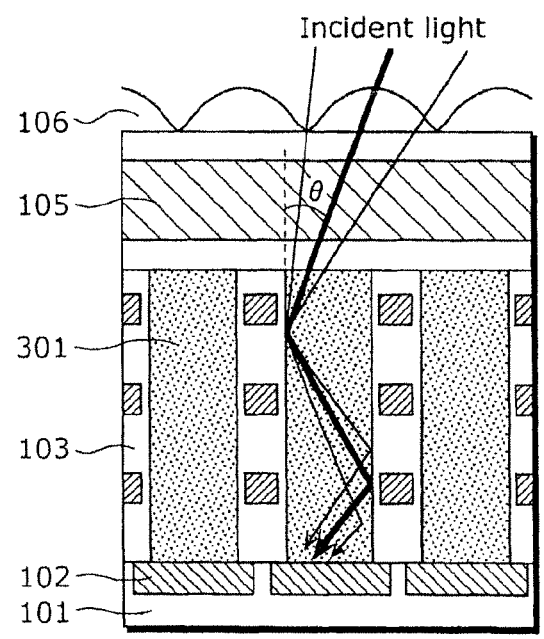
FIG. 20 shows an example of a structure of optical waveguide paths in the conventional technique.

FIG. 17 is a cross-sectional view of a solid-state image sensor (also called "unit-pixels") 54 according to the present embodiment. The "☐" size of the solid-state image sensor 54 is, for example, 1.75 μm square, and the solid-state image sensor 54 includes light-collecting elements (gradient index microlenses) 504, the color filter 2, the interlayer insulation film 3, the wiring layer 4, the photoelectric conversion regions (Si photodiodes) 5, and the Si substrate 6. Optical waveguide regions (optical waveguide paths) 405 are formed penetrating the wiring layer 4, in the interlayer insulation film 3, above each of the photoelectric conversion regions 5. Here, the optical waveguide regions (optical waveguide paths) 405 are formed from SiN (n=2.0) which is a light-transmitting film, and the light-collecting elements 504 consist of a red color transmitting region 111, a green color transmitting region 112, and a blue color transmitting region 113.

Each of the light-collecting elements 504 is a gradient index microlens having an effective refractive index distribution of a light-transmitting film having concentric structural elements each having a line-width approximately equal to or shorter than the wavelength of incident light. In the present embodiment, each of the light collecting elements 504 has one of plural types of light-dispersion functions which are different depending on each of the photoelectric conversion regions 5, and particles including metal are dispersed therein. Each of the light-collecting elements 504 is a medium which transmits 50% or more of infrared light from the visible light that is received by the solid-state image sensor 54 which has a refractive index of 1.4 or greater, and such medium includes metallic inclusion particles of 5 nm to 50 nm particle diameter. Specifically, each of the light-collecting elements 504 is of a structure in which a concentric ring-pattern is engraved in $SiO_2$ (n=1.45) which is a light-transmitting film, and gold of a 5 nm to 50 nm (median value: 15 nm) particle diameter distribution, cobalt-titanium-nickel-zinc oxide of a 5 nm to 50 nm (median value: 25 nm) particle diameter distribution, and cobalt-aluminum oxide of a 5 nm to 50 nm (median value: 20 nm) particle diameter distribution are dispersed in silicon oxide as dispersant particles for the red color transmitting region 111, the green color transmitting region 112, and the blue color transmitting region 113, respectively.

The solid-state image sensor in the present embodiment can also realize the same advantageous effects as the light-collecting characteristics (see FIG. 14) and the light-dispersion characteristics (FIG. 13) shown in Embodiment 3.

FIGS. 18A to 18F show a manufacturing process of the optical waveguide regions 405 according to Embodiment 4.

First, the photoelectric conversion regions 5, the interlayer insulation film 3, and the wiring layer 4 are formed above the Si substrate 6 using the normal semiconductor process (details are not illustrated in FIG. 18). Furthermore, these shall be referred to using the abbreviated name semiconductor integrated circuit 24.

Next, a copper oxide particle solution dispersed in a SOG solution is applied on the semiconductor integrated circuit 24 by spin-on and then fired at 400 degrees Celsius to form a light-absorbing material 120 A resist 22 is applied on the light-absorbing material 120. Subsequently, patterning of the resist 22 is performed using light exposure 25 (FIG. 18A up to this point). After development, color separators 61 are formed through dry etching and wet etching, and the resist is removed (FIG. 18B). Next, a gold particle solution dispersed in a SOG solution is applied by spin-on and provisionally fired at 250 degrees Celsius to form a red color absorbing material 121, and after a resist is applied, patterning of the resist is performed using light exposure again (FIG. 18C). A red color absorbing film 131 is formed through dry etching and wet etching, the resist is removed, and firing at 400 degrees Celsius is performed.

Next, a cobalt-titanium-nickel-zinc oxide particle solution dispersed in a SOG solution is applied by spin-on and provisionally fired at 250 degrees Celsius to form a green color absorbing material 122, and after a resist is applied, pattering of the resist is performed using light exposure again (FIG. 18D). A green color absorbing film 132 is formed through dry etching and wet etching. Here, since the dry etching rate and the wet etching rate of the red color absorbing film 131 which is fired at 400 degrees Celsius are low compared to those of the green color absorbing material 122 which is not sufficiently crystallized by being fired at only 250 degrees Celsius, the red color absorbing film 131 is substantially unetched. Subsequently, the resist is removed and firing at 400 degrees Celsius is performed.

Next, a cobalt-aluminum oxide particle solution dispersed in a SOG solution is applied by spin-on and provisionally fired at 250 degrees Celsius to form a blue color absorbing material 123, and after a resist is applied, patterning of the resist is performed using light exposure again (FIG. 18E). Here, since the dry etching rates and the wet etching rates of the red color absorbing film 131 and the green color absorbing film 132 which are fired at 400 degrees Celsius are low compared to those of the blue color absorbing material 123 which is not sufficiently crystallized by being fired at only 250 degrees Celsius, the red color absorbing film 131 and the green color absorbing film 132 are substantially unetched. Subsequently, a blue color absorbing film 133 is formed through dry etching and wet etching, the resist is removed, and firing at 400 degrees Celsius is performed (FIG. 18F).

As described above, in the solid-state image sensor in the present embodiment, each of the light-collecting elements has one of plural types of light-dispersion functions that are different depending on each of the photoelectric conversion regions, and particles including metal are dispersed in the light-collecting elements. With this, the color filter layer, which is independent of the optical waveguide regions, that is required in the conventional technique becomes unnecessary, and the advantageous effect of further improving sensitivity is produced in addition to the advantageous effect in Embodiment 1.

It should be noted that, after the process shown in FIG. 18F, the light-collecting elements 504 are formed using the same processes shown in Embodiment 1.

It should be noted that, with regard to the light-collecting elements 504, aside from gold, the red color transmitting region 111 may include, as the dispersant particles, at least one of gold, copper, chromium, and iron-chromium oxide. In the same manner, aside from cobalt-titanium-nickel-zinc oxide, the green color transmitting region 112 may include, as the dispersant particles, at least one of cobalt-titanium oxide, nickel-titanium-zinc oxide, and cobalt-zinc oxide. Likewise, aside from cobalt-aluminum oxide, the green color transmitting region 113 may include, as the dispersant particles, at least one of cobalt-aluminum oxide and cobalt-chromium oxide.

Although the solid-state image sensor according to the present invention has been described thus far based on Embodiments 1 to 4, the present invention is not limited to these embodiments. Solid-state image sensors that are realized through various modifications of these embodiments that can be conceived by a person of ordinary skill in the art without departing from the fundamentals of the present invention, and solid-state image sensors that are realized through arbitrary combinations of the constituent elements in the respective embodiments are included in the present invention. For example, a solid-state image sensor that can be obtained by combining the optical waveguide regions in Embodiment 3 and the light-collecting elements in Embodiment 4 is also included in the present invention.

Furthermore, the present invention can be realized not only as a solid-state image sensor, but also as a solid-state imaging device by: arranging such solid-state image sensors two dimensionally to form a pixel array; adding, to each pixel, a MOS transistor which amplifies electric charge generated by the photoelectric conversion in each of the solid-state image sensors; adding a vertical drive circuit which selects pixels aligned in the same row in the pixel array; adding a horizontal drive circuit which scans the signals outputted from one row of pixels and outputs the signals on a per pixel basis; and so on. In addition, the present invention can also be realized as a digital camera by adding a lens, a signal processing unit, a processor, a memory, and so on, to such a solid-state imaging device.

INDUSTRIAL APPLICABILITY

By having a high-sensitivity light-collecting element which reduces the increase of light-collection loss and color mixing, the solid-state image sensor according to the present invention can be used, for example, as a solid-state image sensor in a digital camera, a cellular phone, and so on, and allows for the miniaturization of such devices and the improvement of picture quality of captured images.

REFERENCE SIGNS LIST

2 Color filter
3 Interlayer insulation film
4 Wiring layer
5 Photoelectric conversion regions
6 Si substrate
8 Semiconductor integrated circuit
12 Light-transmitting film ($SiO_2$)
13 Light-transmitting film (SiN)
14 Light exposure
15 Etching
16 BARC material
22 Resist
24 Semiconductor integrated circuit
25 Light exposure
51-54 Solid-state image sensor
61 Color separators
101 Si substrate
102 Photoelectric conversion regions (Photodiodes)
103 Interlayer insulation film
104 Wiring layer
105 Color filter
106 On-chip lens
111 Red color transmission region
112 Green color transmission region
113 Blue color transmission region
120 Light absorbing material
121 Red color absorbing material
122 Green color absorbing material
123 Blue color absorbing material
131 Red color absorbing film
132 Green color absorbing film
133 Blue color absorbing film
301 Optical waveguide regions
401 Optical waveguide regions
402 Optical waveguide regions (Red color transmissive)
403 Optical waveguide regions (Green color transmissive)
404 Optical waveguide regions (Blue color transmissive)
405 Optical waveguide regions (Optical waveguide paths)
501, 502 Light-collecting elements
502a First region
502b Second region
503, 504 Light-collecting elements

The invention claimed is:

1. A solid-state image sensor comprising:
a substrate;
unit-pixels arranged on said substrate;
a wiring layer formed on said unit-pixels;
optical waveguide regions each formed on a photoelectric conversion region included in a corresponding one of said unit-pixels, and penetrating said wiring layer; and
light-collecting elements each formed above a corresponding one of said optical waveguide regions, wherein:
each of said light-collecting elements is a gradient index microlens having an effective refractive index distribution,
each of said light-collecting elements includes a first region having a function for deflecting incident light and a second region having a function for deflecting and collecting the incident light, and
a refractive index distribution of the first region is represented by a primary expression of a distance from a center of each of said unit-pixels.

2. The solid state image sensor according to claim 1, wherein light incident on the first region becomes parallel wavefronts.

3. The solid state image sensor according to claim 1, wherein the first region having the function for deflecting incident light has a width that is equal to or greater than a wavelength of light incident on said light-collecting element and equal to or less than a width of an aperture of the corresponding one of said optical waveguide regions.

4. The solid state image sensor according to claim 1, wherein each of said light-collecting elements has an effective refractive index distribution of a light-transmitting film having concentric structural elements each having a linewidth approximately equal to or shorter than the wavelength of incident light.

5. The solid state image sensor according to claim 1, wherein said optical waveguide regions are of plural types having different light absorption characteristics.

6. The solid state image sensor according to claim 5, wherein a high-refractive index medium making up said optical waveguide regions is mainly made of a metal oxide, and particles that are between 5 nm and 100 nm in diameter are further dispersed in the high-refractive index medium, the particles being first metallic inclusion particles which include a metal that is different from a metal included in the metal oxide.

7. The solid state image sensor according to claim 6, wherein said optical waveguide regions include a first-type optical wave guide region, a second-type optical waveguide region, and a third-type optical waveguide region, said first-type optical waveguide region including at least one of gold, copper, chromium, and iron-chromium oxide as the first metallic inclusion particles, said second-type optical waveguide region including at least one of cobalt-titanium oxide, nickel-titanium-zinc oxide, and cobalt-zinc oxide as the first metallic inclusion particles, and said third-type optical waveguide region including at least one of cobalt-aluminum oxide and cobalt-chromium oxide as the first metallic inclusion particles.

8. The solid state image sensor according to claim 1, wherein each of said light-collecting elements has one of plural types of light-dispersion functions that are different depending on a corresponding one of said photoelectric conversion regions, and second metallic inclusion particles which include a metal are dispersed in said light-collecting elements.

9. The solid state image sensor according to claim 8, wherein each of said light-collecting elements is a medium which transmits 50% or more of infrared light included in visible light received by said solid-state image sensor having a refractive index of 1.4 or greater, and the medium includes the second metallic inclusion particles that are between 5 nm and 50 nm in diameter.

10. The solid state image sensor according to claim 9, wherein said light-collecting elements include a first-type light-collecting element, a second-type light-collecting element, and a third-type light-collecting element, said first-type light collecting element including at least one of gold, copper, chromium, and iron-chromium oxide as the second metallic inclusion particles, said second-type light-collecting element including at least one of cobalt-titanium oxide, nickel-titanium-zinc oxide, or cobalt-zinc oxide as the second metallic inclusion particles, and said third-type light-collecting element including at least one of cobalt-aluminum oxide, and cobalt-chromium oxide as the second metallic inclusion particles.

11. The solid state image sensor according to claim 1, wherein the first region does not have a function for collecting incident light.

12. A solid-state image sensor comprising:
a substrate;
unit-pixels arranged on said substrate;
a wiring layer formed on said unit-pixels;
optical waveguide regions each formed on a photoelectric conversion region included in a corresponding one of said unit-pixels, and penetrating said wiring layer; and
light-collecting elements each formed above a corresponding one of said optical waveguide regions, wherein:
each of said light-collecting elements is a gradient index microlens having an effective refractive index distribution, and
each of said light-collecting elements includes a first region having a function for deflecting incident light and not having a function for collecting the incident light, and a second region having a function for deflecting and collecting the incident light.

13. The solid state image sensor according to claim 12, wherein light incident on the first region becomes parallel wavefronts.

14. The solid state image sensor according to claim 12, wherein the first region having the function for deflecting incident light has a width that is equal to or greater than a wavelength of light incident on said light-collecting element and equal to or less than a width of an aperture of the corresponding one of said optical waveguide regions.

15. The solid state image sensor according to claim 12, wherein each of said light-collecting elements has an effective refractive index distribution of a light-transmitting film having concentric structural elements each having a linewidth approximately equal to or shorter than the wavelength of incident light.

16. The solid state image sensor according to claim 12, wherein said optical waveguide regions are of plural types having different light absorption characteristics.

17. The solid state image sensor according to claim 16, wherein a high-refractive index medium making up said optical waveguide regions is mainly made of a metal oxide, and particles that are between 5 nm and 100 nm in diameter are further dispersed in the high-refractive index medium, the particles being first metallic inclusion particles which include a metal that is different from a metal included in the metal oxide.

18. The solid state image sensor according to claim 17, wherein said optical waveguide regions include a first-type optical wave guide region, a second-type optical waveguide region, and a third-type optical waveguide region, said first-type optical waveguide region including at least one of gold, copper, chromium, and iron-chromium oxide as the first metallic inclusion particles, said second-type optical waveguide region including at least one of cobalt-titanium oxide, nickel-titanium-zinc oxide, and cobalt-zinc oxide as the first metallic inclusion particles, and said third-type optical waveguide region including at least one of cobalt-aluminum oxide and cobalt-chromium oxide as the first metallic inclusion particles.

19. The solid state image sensor according to claim 12, wherein each of said light-collecting elements has one of plural types of light-dispersion functions that are different depending on a corresponding one of said photoelectric conversion regions, and second metallic inclusion particles which include a metal are dispersed in said light-collecting elements.

20. The solid state image sensor according to claim 19, wherein each of said light-collecting elements is a medium which transmits 50% or more of infrared light included in visible light received by said solid-state image sensor having a refractive index of 1.4 or greater, and the medium includes the second metallic inclusion particles that are between 5 nm and 50 nm in diameter.

* * * * *